United States Patent [19]

Ishizawa et al.

[11] 4,226,933
[45] Oct. 7, 1980

[54] METHOD OF MANUFACTURING A DECORATIVE PANEL

[75] Inventors: Hideo Ishizawa, Tokyo; Akira Niwayama, Matsudo; Mitsuru Shimizu, Kamifukuoka; Takashi Kagami, Tokyo, all of Japan

[73] Assignee: Toppan Printing Co., Ltd., Tokyo, Japan

[21] Appl. No.: 964,296

[22] Filed: Nov. 28, 1978

[51] Int. Cl.² .................. G03F 5/00; G03C 1/90; G03C 5/00

[52] U.S. Cl. .................. 430/320; 430/290; 430/322; 430/327; 430/258; 430/396; 430/494; 430/496; 430/531; 430/930; 430/935; 430/950; 430/961

[58] Field of Search .................. 96/38.1, 38.2, 83, 35, 96/35.1; 430/290, 320, 322, 327, 258, 396, 494, 496, 531, 930, 935, 950, 961

[56] References Cited

U.S. PATENT DOCUMENTS

| | | | |
|---|---|---|---|
| 3,159,485 | 12/1964 | Van Hoof et al. | 96/35 X |
| 3,315,602 | 4/1967 | Clark et al. | 96/35 X |
| 3,317,318 | 5/1967 | Backus et al. | 96/38.1 X |
| 3,482,973 | 12/1969 | Amidon et al. | 96/35 |
| 3,671,236 | 6/1972 | Beusekom | 96/35 X |
| 3,678,850 | 7/1972 | Gundlac | 96/35 X |
| 4,002,478 | 1/1977 | Kokawa et al. | 96/38.1 |
| 4,017,312 | 4/1977 | Erskine et al. | 96/35.1 X |
| 4,069,076 | 1/1978 | Fickes | 96/83 X |

FOREIGN PATENT DOCUMENTS 52-28465  7/1977  Japan .

OTHER PUBLICATIONS

Haining et al., Liquid Interface for Photoresist, IBM Tech. Disc. Bull., vol. 14, No. 9, Feb. 1972.

Primary Examiner—Edward C. Kimlin
Attorney, Agent, or Firm—Frishauf, Holtz, Goodman and Woodward

[57] ABSTRACT

A method of manufacturing a decorative panel having an embossed surface and different degrees of gloss corresponding to a pattern, thereby producing a stereoscopic aspect, i.e., the impression of relief and solidity.

3 Claims, 2 Drawing Figures

METHOD OF MANUFACTURING A DECORATIVE PANEL

BACKGROUND OF THE INVENTION

This invention relates to a method of manufacturing a decorative panel having an embossed surface and different degrees of gloss corresponding to a pattern appearing thereon, thereby producing a stereoscopic aspect, namely, the impression of relief and solidity.

The object of the invention is to provide a method of manufacturing a novel decorative panel displaying not only a color effect but also a design effect resulting from an embossed surface and different degrees of gloss corresponding to a pattern appearing on said decorative panel, thereby producing the stereoscopic aspect, namely, the impression of relief and solidity.

SUMMARY OF THE INVENTION

According to the method of this invention, a pigment-containing sheet impressed with a pattern for color effect is laminated by an adhesive on a substrate made of, for example, plywood. Applied on the surface of said laminate is a photohardening paint prepared by mixing a photohardening synthetic resin such as polyester resin with a matting agent, photosensitizer, and peroxide catalyst. A smooth transparent film having a prescribed degree of gloss is tightly spread over the surface of the laminate coated with the photohardening paint. The film surface is lightly pressed by a rubber roller to drive out air bubbles contained in the paint. An inert and nonvolatile liquid substance which remains viscous at normal temperature is applied on the surface of the film. A mask selectively rendered transparent and opaque is closely attached to the liquid substance so as to cause the transparent portions of said mask to be aligned with the whole or part of a pattern impressed on the pigment-containing sheet and also the opaque portions of said mask to be aligned with the whole or part of the other portions of said sheet than those which display the pattern. The mask surface is gently pressed by a rubber roller to expel air bubbles contained in the liquid substance. Light is projected over the mask, causing the illuminated portions of the photohardening synthetic resin to be photohardened. The interior of even those portions of said photohardening synthetic resin which are not exposed to light are hardened to a certain extent by the action of the aforesaid peroxide catalyst. The film, together with the mask is stripped off when the illuminated portions of the photohardening synthetic resin are fully hardened, and while the unilluminated portions of said synthetic resin are not sufficiently hardened. As the result, the illuminated fully photohardened portions of the synthetic resin take a convex form due to shrinkage, thereby pulling the adjacent unilluminated slowly hardened portions. The convex portions of the synthetic resin have the same smooth surface as that of the film. The other portions of the synthetic resin than said convex portions are pulled toward the fully photohardened convex portions to take a concave form, and indicating a matted state by the action of the matting agent.

DESCRIPTION OF THE PREFERRED EMBODIMENTS

There will now be described by reference to the accompanying drawing a decorative panel embodying this invention.

Figure 1:
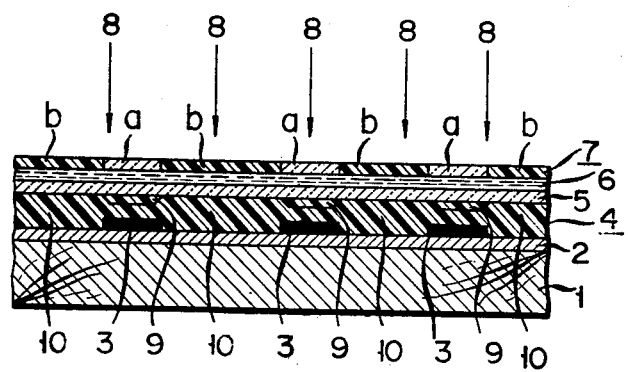
FIGS. 1 and 2 are sectional views of a decorative panel embodying this invention.
Figure 2:
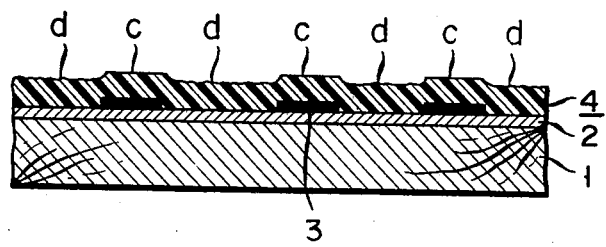

A pigment-containing sheet 2 impressed with a pattern 3 is laminated by means of an adhesive on a substrate 1 made of, for example, plywood. Applied on the surface of said laminated body is a photohardening synthetic resin paint 4 prepared by mixing polyester resin with a matting agent, photosensitizer, peroxide catalyst and, if necessary, a promoter of photosensitization. A smooth transparent film 5 is tightly spread over the photohardening paint 4. The surface of said film 5 is gently pressed by a rubber roller to expel air bubbles contained in the paint 4. The smooth transparent film 5 is coated with a transparent, inert, and nonvolatile liquid substance 6 which remains viscous at normal temperature, for example, fluid paraffin. A mask film 7 selectively rendered transparent and opaque is tightly attached to the paraffin coating 6 so as to cause the transparent portions (a) of said mask 7 to be aligned with the whole or part of a pattern impressed on the pigment-containing sheet 2 and also the opaque portions (b) of said mask 7 to be aligned with the whole or part of the other portions of said sheet 2 than those which display the pattern. The surface of the mask 7 is softly pressed by a rubber roller to drive out air bubbles contained in the fluid paraffin 6. The fluid paraffin 6 inserted between the transparent film 5 and mask 7 wraps (i.e., surrounds) dust particles carried into a space defined therebetween, thereby preventing undesirable blots or stains from appearing on the surface of a decorative panel and bringing the film 5 and mask 7 into fully tight contact with each other to elevate the light-obstructing effect of the mask 7. Rays 8 of a light are projected on the assembled mass. The illuminated portions 9 of the photohardening synthetic resin paint 4 (corresponding to the light-permeable section (a) of the mask 7) are photohardened. The interior of those portions 10 of said photohardening synthetic resin paint 4 (corresponding to the light-impermeable section (b) of the mask 7) is also hardened to a certain extent by the action of the peroxide catalyst. The transparent film 5, fluid paraffin 6 and mask 7 are stripped off at once when the illuminated portions 9 of the photohardening synthetic resin paint 4 are fully photohardened, and while the unilluminated portions 10 thereof are not sufficiently hardened. As shown in FIG. 2, the illuminated portions 9 of the photohardening synthetic resin paint 4 indicate the same smooth glossy state (c) as the transparent film 5. The illuminated portions 9 are photohardened, whereas the unilluminated portions 10 are not completely hardened. The illuminated portions 9 are contracted due to photohardening and take a convex form, pulling the adjacent unilluminated portions 10. The unilluminated portions 10 are hardened by the action of the peroxide catalyst, but at a slower rate than the illuminated portions 9. The film 5 is peeled off while the unilluminated portions 10 are not sufficiently hardened. During the subsequent slow hardening of the unilluminated portions 10, the matting agent contained in the photohardening synthetic resin paint 4 floats to the surface, which consequently indicates a roughened matted state (d). The illuminated portions 9 are converted into a concave form by the pulling force of the illuminated, contracted convex portions 9. Thus, the illuminated portions 9 take a convex form and the unilluminated portions 10 are converted into a concave matted form in conformity to a pattern impressed on the pigment-containing sheet, thereby providing a decorative panel producing the impression of relief and solidity.

A photohardening paint prepared from photohardening synthetic resin such as polyester resin containing the aforesaid photosensitizer has its surface hardened upon exposure to light. Therefore, the surface of said paint contacted by a smooth film is first hardened and shows the same glossy state as said film. On the other hand, the interior of the unilluminated portions of the photohardening synthetic resin paint is slowly hardened at the uniform rate solely by the action of the peroxide catalyst. Said unilluminated portions are matted by the action of the matting agent, so long as the photohardening process is not carried to the full.

A substrate used in the method of this invention includes plywood, uninfammable wooden board, metal plate, and thick paper sheet. The photohardening synthetic resin paint may be prepared from either the wax-hardened or nonwax-hardened type of polyester resin. However, the nonwax-hardened type is preferred. Where the wax-hardened type polyester resin is used, difficulties arise in completing photohardening after the film is removed.

The film used in the invention preferably includes those formed of vinylon, cellophane, and polyester.

The matting agent used in the invention preferably includes silicon dioxide, calcium carbonate, magnesium carbonate, potassium sulfate, alumina and clay. The matting agent should preferably be applied in fine particles having a size of 0.5 to 5 microns. The added proportion of the matting agent varies with the required extent of matting. However, silicon dioxide, for example, is desired to be added to polyester resin at the rate of 1 to 20% by weight, or preferably 3 to 10% by weight. The latter proportion provides any desired level of luster ranging between full matting and full gloss.

The photosensitizer used in the invention includes benzoin, benzoin methyl ether, benzoin ethyl ether, benzoin propyl ether, and eosine. The added proportion of the photosensitizer is chosen to be 0.1 to 10 or preferably 1 to 3 parts by weight per 100 parts by weight of polyester resin. The peroxide catalyst used in the invention includes organic peroxides such as benzoyl peroxide, methylethyl ketone peroxide, cyclohexane peroxide, and lauroyl peroxide.

The promoter of photosensitivity used in the invention includes a cobalt type promoter, vanadium type promoter, manganese type promoter and amine promoter.

The liquid substance used in the invention includes fluid paraffin; fatty acid ester; fatty acid amide; higher alcohols; glycerin; the nondriable type of the higher fatty acids; transparent vegitable oils such as palm oil, soybean oil, olive oil, etc; plasticizers such as phthalic esters, phosphoric esters, aliphatic esters, etc.; and petroleum-base oils such as paraffin sulfide, etc.

According to the method of this invention, a liquid substance 6 such as fluid paraffin lies between the film 5 having a prescribed degree of smoothness and gloss and the mask 7. Where, therefore, foreign matter such as dust is carried into a space defined between the film 5 and mask 7 due to their static effect, the dust is wrapped in the liquid substance 6. Consequently, no blots or stains appear on the surface of a decorative panel. The liquid substance 6 ensures a tight contact between the film 5 and mask 7, elevating the light-obstructing effect of the mask 7.

This invention enables the gloss of a decorative panel to be freely controlled by peeling off a film and mask in consideration of the kind and content of a matting agent used, and also in accordance with the rate at which photohardening proceeds by the action of a peroxide catalyst. A preferred embodiment of the method of this invention for applying photohardening synthetic resin comprises the steps of first causing a photohardening synthetic resin such as unsaturated polyester resin mixed with a peroxide catalyst, and, if required, a promoter to thoroughly seep into a sheet of paper and then applying a second layer of the same type of photohardening synthetic resin containing not only the above-mentioned catalyst and promoter, but also a matting agent and photosensitizer on said sheet of paper.

Both layers of unsaturated polyester resin which contain a peroxide catalyst are effectively photohardened. Further, the first applied unsaturated polyester resin layer which is free of a matting agent is saved from the difficulty with which a single layer of photohardening unsaturated polyester resin having a high viscosity due to the presence of a matting agent might seep into the tissue of paper, thereby improving the toughness of the resin-impregnated paper sheet.

Since the matting agent is only contained in the subsequently applied photohardening resin layer, the impact strength of a decorative panel is improved. The second photohardening resin layer which does not seep into the paper tissue due to a high viscosity resulting from the presence of a matting agent elevates the embossed effect. An expensive photosensitizer is only contained in said second photohardening resin layer, contributing to the reduction of the cost of a decorative panel.

This invention will be moe fully understood by reference to the following example.

EXAMPLE

A 3 mm thick board of lauan plywood was laminated with a 80 g/m² sheet of titanium impressed with a pattern of cedar grains by an adhesive prepared from 100 parts by weight of vinyl acetate emulsion, 40 parts by weight of urea, and 2 parts by weight of ammonium chloride. The laminate was used as a substrate. Applied on the surface of the substrate was 250 g/m² of a photohardening synthetic resin paint having the following composition.

|  | Parts by weight |
|---|---|
| Unsaturated polyester resin (manufactured by Dai Nihon Ink Chemical Industry Co., Ltd.) | 100 |
| Styrene monomer | 15 |
| Benzoyl ethyl ether (manufactured by Wako Pure Medicine Mfg. Co., Ltd.) | 1 |
| Cobalt naphthanate containing 8% of Co (manufactured by Nihon Chemical Industry Co., Ltd.) | 0.5 |
| Methylethyl Ketone peroxide (55%) (manufactured by Kawaguchi Chemical Mfg. Co., Ltd.) | 1 |
| Silicon dioxide | 5 |

A smooth glossy vinyl film 25 microns thick was spread over the photohardening synthetic resin paint having the above-mentioned composition which was coated on the substrate made of the aforesaid laminate. The film surface was lightly pressed by a handroll to expel air bubbles from the interior thereof. Fluid paraffin was applied on the surface of the film. A mask film formed of Tetron posifilm was placed on the fluid paraffin in alignment with a pattern of the sheet to render the winter-produced cedar grain pattern light-permeable and the other portions opaque. The surface of the Tetron posifilm mask was pressed by a rubber roll to ensure tight contact between the fluid paraffin and Tetron posifilm mask.

Light was projected 10 minutes on the assembled mass by a polymerization fluorescent lamp (A.C. 120 W) (manufactured by Matsushita Electric Appliance Mfg. Co., Ltd. under the trademark "FLR 120, EHBA-317") from a point 15 cm apart. After the projection of light was brought to an end, the Tetron posifilm mask and vinylon film were removed. The winter produced ceder grain pattern displayed glossy convex form and the other portions were converted into a matted concave form, providing a polyester decorative panel of an excellent design effect, which produced a prominent impression of relief and solidity.

What we claim is:

1. A method of manufacturing a decorative panel producing a prominent impression of relief and solidity corresponding to a pattern appearing thereon which comprises the steps of laminating by an adhesive a pigment-containing sheet impressed with a pattern for color effect on a substrate; coating the surface of the laminate with a photohardening paint prepared from a photohardening synthetic resin mixed with a matting agent, photosensitizer and peroxide catalyst; tightly spreading a transparent smooth film displaying a prescribed degree of gloss over the coated surface of the laminate; lightly pressing the surface of the transparent smooth film by a rubber roller to drive out air bubbles contained in the photohardening paint; applying on the transparent smooth film a layer of an inert, nonvolatile, transparent liquid substance which remains viscous at normal temperature; tightly mounting a mask film which is selectively rendered transparent and opaque on the liquid substance so as to cause the transparent portions of said mask to be aligned with the whole or part of a pattern impressed on the pigment-containing sheet and also the opaque portions of said mask to be aligned with the whole or part of the other portions of said sheet than those which display the pattern; the layer of liquid substance wrapping or surrounding dust which may be present between the transparent smooth film and the mask film; gently pressing the surface of the mask by a rubber roller to expel air bubbles contained in the liquid substance projecting a light on the mask to effect the photohardening of the illuminated portions of the photohardening synthetic resin paint with the interior of the unilluminated portions of said paint hardened to a certain extent by the action of the peroxide catalyst; and removing the transparent smooth film and mask film when the illuminated portions of the photohardening synthetic resin paint are fully hardened and while the other unilluminated portions thereof are not sufficiently hardened, thereby causing the photohardened portions of the paint to take a convex form due to shrinkage, and to pull the adjacent unilluminated slowly hardening portions, the surface of said convex portions displaying the same glossy state as that of the film surface and also causing the other unilluminated portions to be pulled toward the illuminated portions to take a concave form and become matted by the action of the matting agent.

2. The method according to claim 1, wherein the liquid substance is fluid paraffin.

3. The method according to claim 1, wherein said mask film is formed of Tetron posifilm.

* * * * *